United States Patent
Lin

(10) Patent No.: US 7,276,946 B2
(45) Date of Patent: Oct. 2, 2007

(54) MEASURE-CONTROLLED DELAY CIRCUITS WITH REDUCED PHASE ERROR

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/892,805

(22) Filed: Jul. 16, 2004

(65) Prior Publication Data

US 2006/0012410 A1  Jan. 19, 2006

(51) Int. Cl.
    *H03L 7/00* (2006.01)
(52) U.S. Cl. ............ 327/158; 327/149; 327/141
(58) Field of Classification Search ........ 327/147–149, 327/156–159, 141
    See application file for complete search history.

(56) References Cited

U.S. PATENT DOCUMENTS

| | | | |
|---|---|---|---|
| 4,868,430 A | 9/1989 | Stewart | 327/279 |
| 5,245,231 A * | 9/1993 | Kocis et al. | 327/277 |
| 5,459,402 A | 10/1995 | Ueno et al. | 324/617 |
| 5,708,382 A * | 1/1998 | Park | 327/277 |
| 5,990,714 A | 11/1999 | Takahashi | 327/149 |
| 6,081,147 A | 6/2000 | Okajima | 327/284 |
| 6,198,690 B1 * | 3/2001 | Kato et al. | 365/233 |
| 6,388,484 B1 * | 5/2002 | Kamoshida et al. | 327/161 |
| 6,509,775 B2 | 1/2003 | Saeki | 327/271 |
| 6,686,788 B2 | 2/2004 | Kim et al. | 327/280 |
| 6,727,734 B2 | 4/2004 | Gomm | 327/156 |
| 6,933,758 B2 * | 8/2005 | Kim et al. | 327/161 |
| 2003/0231042 A1 | 12/2003 | Lin et al. | |
| 2004/0044918 A1 | 3/2004 | Dermott et al. | |
| 2004/0090255 A1 | 5/2004 | Ajit | |
| 2004/0178836 A1 | 9/2004 | Kim et al. | |

* cited by examiner

*Primary Examiner*—Dinh T. Le
(74) *Attorney, Agent, or Firm*—Fish & Neave IP Group of Ropes & Gray LLP; Jeffrey H. Ingerman; Chia-Hao La

(57) ABSTRACT

Measure-controlled delay (MCD) circuits include a measure circuit and sample circuit for synchronizing an output clock to an input clock. In response to triggering of the measure circuit, sample circuits sample outputs of a measure delay array. Sample reset logic prevents output of the output clock when any of a predetermined one or more of the samples correspond to a particular logic value (i.e., logic "1" or "0"). For example, sample reset logic may prevent an MCD circuit from providing the output clock when a sample taken from the earliest sampling point of the measure delay array corresponds to logic "1." The MCD circuit may then provide the output clock in response to a subsequent triggering for which a sample taken from the earliest sampling point is logic "0." Phase error of the output clock is thereby reduced. MCD circuits improve response to process, voltage and temperature (PVT) variations.

30 Claims, 6 Drawing Sheets

MEASURE-CONTROLLED DELAY CIRCUITS WITH REDUCED PHASE ERROR

BACKGROUND OF THE INVENTION

This invention relates to clock synchronization circuits. More particularly, this invention relates to measure-controlled delay (MCD) circuits with reduced phase error. This invention also relates clock synchronization circuits with improved response to process, voltage and temperature (PVT) variations.

Electronic systems often include multiple circuit subsystems (e.g., devices located on a circuit board or chip) that synchronize their respective processes to the same system clock. These processes may be related and required to rigidly comply with precise timing requirements. For example, in high speed memory devices, memory access by one or more electronic circuit subsystems must generally be precisely coordinated. Typically, a clock synchronization circuit synchronizes the clock output by a circuit subsystem to the system clock. This allows the circuit subsystem to perform internal processing and to output the results of this processing according to system timing requirements.

One type of clock synchronization circuit is an MCD circuit. In general, MCD circuits have advantageously faster lock times than do other types of clock synchronization circuits (e.g., digital delay-locked loop (DDLL) circuits). An MCD circuit typically includes a measure delay array, a plurality of sample circuits operative to sample outputs of the measure delay array, and other clock synchronization circuitry. Logic values (i.e., logic "0" or logic "1") corresponding to samples taken from the outputs of the measure delay array indicate an amount of delay to apply to an input clock in order to generate an output clock. Thus, the output clock is generated with a significant phase error relative to the input clock when the logic values indicate an inappropriate amount of delay. This phase error may adversely affect the ability of an associated circuit subsystem to, for example, comply with system timing requirements.

PVT variations may also adversely affect the ability of a circuit subsystem to comply with system timing requirements. In particular, variations in process, voltage and temperature can prevent a clock synchronization circuit from synchronizing an output clock to an input clock.

In view of the foregoing, it would be desirable to provide measure-controlled delay circuits with reduced phase error. It would also be desirable to provide clock synchronization circuits with improved response to PVT variations.

SUMMARY OF THE INVENTION

It is an object of this invention to provide measure-controlled delay (MCD) circuits with reduced phase error.

It is also an object of this invention to provide clock synchronization circuits with improved response to process, voltage and temperature (PVT) variations.

In accordance with this invention, an MCD circuit is provided with sample reset logic. In response to triggering of a measure circuit, sample circuits sample outputs of a measure delay array. The sample reset logic prevents the MCD circuit from providing an output clock when any of a predetermined number of samples corresponds to a particular logic value (i.e., logic "1" or "0"). For example, the sample reset logic may prevent the MCD circuit from providing the output clock when a sample taken from the earliest sampling point of the measure delay array corresponds to a logic "1." The output clock is provided in response to a subsequent triggering of the measure circuit for which a sample taken from the earliest sampling point is logic "0" (i.e., the logic invert of logic "1"). Phase error of the output clock relative to an input clock is thereby reduced.

Clock synchronization circuits with improved response to process, voltage and temperature (PVT) variations are also provided. A forward delay array of an MCD circuit is provided with one or more "spare" delay units. In general, the spare delay units are positioned as the first or last delay units in the serially-coupled chain of delay units of the forward delay array. The spare delay units are not selected provide the output or to receive the input of the forward delay array during initial clock synchronization by the MCD circuit. Therefore, when an associated digital delay-locked loop (DDLL) circuit takes over from the MCD circuit to maintain an output clock synchronized to an input clock, the spare delay units are substantially always available for selection by the DDLL circuit to adjust the amount of delay applied by the forward delay array. The DDLL can therefore maintain the synchronized condition of the output clock over a wider range of PVT variations.

The invention also provides methods of reducing phase error of MCD circuits and methods of improving PVT response of a clock synchronization circuit.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention is directed to reducing phase error of measure-controlled delay (MCD) circuits. Illustrative MCD circuits are described in commonly-assigned U.S. Publication No. US 2004/0044918, which is hereby incorporated by reference herein in its entirety.

Figure 1:
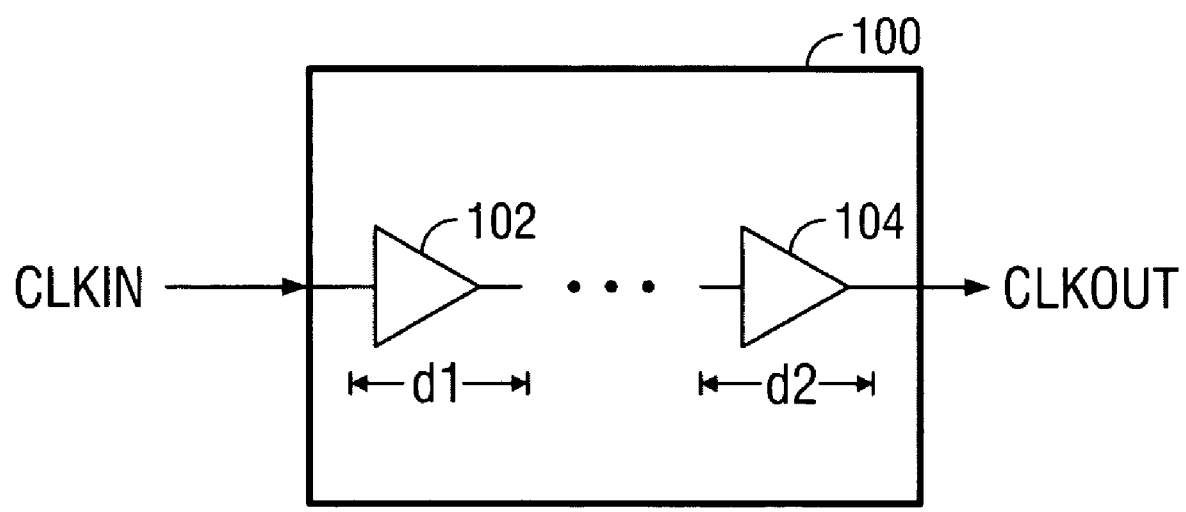
FIG. 1 shows a block diagram of an illustrative electronic device or chip.

FIG. 1 shows a block diagram of an illustrative electronic device or chip 100 (e.g., a dynamic random access memory (DRAM) chip). Device 100 includes input circuitry 102 and output circuitry 104. Each of input circuitry 102 and output circuitry 104 may include one or more buffers and/or other logic circuitry. Input circuitry 102 receives CLKIN as input, and delays (i.e., phase shifts) CLKIN by a first delay (d1). CLKIN may be received by device or chip 100 from, for example, another chip or device (e.g., a system clock generator). Output circuitry 104 further delays CLKIN by a second delay (d2). In general, when no clock synchronization circuitry is present in device 100 (e.g., when input circuitry 102 is connected directly to output circuitry 104), device 100 outputs CLKOUT undesirably phase-shifted relative to CLKIN by a phase proportional to (d1+d2).

Figure 2:
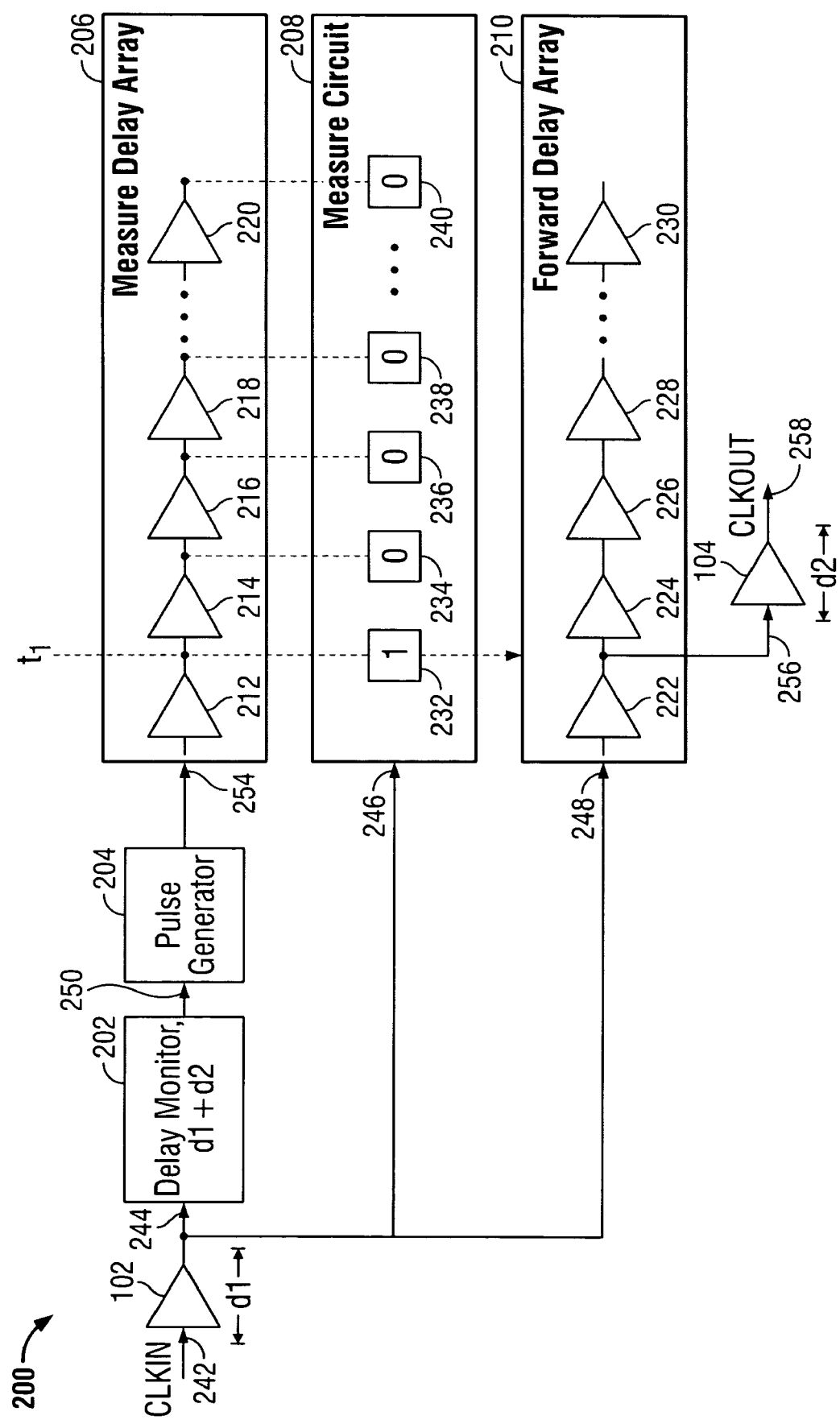
FIG. 2 is a block diagram of an illustrative measure-controlled delay circuit implemented on the device or chip of FIG. 1.

FIG. 2 shows an illustrative MCD circuit 200 that may be implemented on the device or chip shown in FIG. 1. MCD circuit 200 includes input circuitry 102 (FIG. 1), output circuitry 104 and clock synchronization circuitry including delay monitor 202, pulse generator 204, measure delay array 206, measure circuit 208 and forward delay array 210. Measure delay array 206 includes a plurality of delay units 212, 214, 216, 218 and 220 coupled in series. Forward delay array 210 also includes a plurality of delay units 222, 224, 226 and 228 coupled in series. In general, measure delay array 206 and forward delay array 210 include the same number (N) of delay units (e.g., N=6). Additionally, the characteristic time delay ($t_{UD}$) associated with each of delay units 212-220 and 232-240 is generally the same. Measure circuit 208 includes a plurality of sample circuits 232, 234, 236, 238 and 240 (e.g., registers or latches) operative to store logic values (i.e., logic "1" or logic "0") that correspond respectively to samples taken from the outputs of delay units 212-220.

MCD circuit 200 operates as follows: Input circuitry 102 receives CLKIN at input 242 and delays CLKIN by d1. The output of input circuitry 102 is coupled to input 244 of delay monitor 202, input 246 of measure circuit 208 and input 248 of forward delay array 210. Delay monitor 202 delays input signal 244 by about (d1+d2), where (d1+d2) is equal to the total delay introduced to CLKIN by input circuitry 102 and output circuitry 104. For example, delay monitor 202 may include circuitry similar to circuitry 102 coupled in series with circuitry similar to circuitry 104. In other words, delay monitor 202 models the time delay (i.e., phase shift) introduced to CLKIN by input circuitry 102 and output circuitry 104. The rest of MCD clock synchronization circuitry 204-210 must then measure and adjust for this delay in order to synchronize CLKOUT with CLKIN. In some embodiments, delay monitor 202, input circuitry 102 and output circuitry 104 may not be included in MCD circuit 200 such as, for example, when CLKOUT of MCD circuit 200 is implemented for use only in connection with internal processing of a device or chip (e.g., device or chip 100) and not to synchronize the output of the device or chip.

The output of delay monitor 202 is coupled to input 250 of pulse generator 204. Pulse generator 204 converts each rising edge of input signal 250 to a narrow pulse (e.g., pulse width ($t_{pulse}$)=800 picoseconds (ps)), and outputs this pulse to input 254 of measure delay array 206 (i.e., the input of delay unit 212). Various circuits and methods for generating a pulse for input to a measure delay array are described in above-incorporated U.S. Publication No. US 2004/0044918. The pulse propagates through delay units 212-220 until measure circuit 208 is triggered (e.g., until said sample circuits 232-240 are triggered) at time ti by a rising edge of input signal 246. In response to the triggering, the outputs of delay units 212-220 of measure delay array 206 are respectively sampled by sample circuits 232-240. Logic values (i.e., logic "0" or logic "1") that correspond to these samples and that approximate the position of the pulse in measure delay array 206 at time t1 are stored by sample circuits 232-240. For example, sample circuit 232 stores a logic "1," which indicates that the pulse was sampled at the output of corresponding delay unit 212 at time t1. Measure circuit 208 then selects the amount of delay that forward delay array 210 applies to signal 248 (i.e., which delay units 222-230 that signal 248 passes through) based on the logic values stored by sample circuits 232-240. The way that measure circuit 208 selects this amount of delay is described below. Output circuitry 104 receives the output signal of forward delay array 210 at input 256. Output circuitry 104 then delays input signal 256 by d2 in order to provide CLKOUT at output 258.

In general, the position of the pulse falling edge (i.e., the trailing edge) at the time measure circuit 208 is triggered (e.g., time t1) indicates the amount of delay that must be applied to signal 248 in order to synchronize CLKOUT with CLKIN. This is because, in general, the pulse falling edge corresponds to the rising edge of the signal output by delay monitor 302. Timing aspects of such a pulse are further described in above-incorporated U.S. Publication No. US 2004/0044918. Measure circuit 208 approximates the position of the pulse falling edge at time t1 using the following approach: First, measure circuit 208 detects which of sample circuits 232-240 storing a logic "1" is the "leftmost" sample circuit (i.e., the sample circuit storing a logic "1" that corresponds to the earliest delay unit in the serially-coupled chain of delay units 212-220; e.g., sample circuit 232 in the example of FIG. 2). Measure circuit 208 may then select the particular delay unit of delay units 222-230 that corresponds to the detected sample circuit to provide the output of forward delay array 210. For example, measure circuit 208 may select delay unit 222 to provide the output of forward delay array 210 in response to detecting that sample circuit 232 stores a logic "1." Input 248 may be coupled to the input of delay unit 222. This sets the amount of delay applied to signal 248 equal to the characteristic unit delay (i.e., $t_{UD}$) of delay unit 222. Alternatively, measure circuit 208 may select a particular delay unit of delay units 222-230 to receive signal 248 as input in order to set the amount of delay applied to signal 248. For example, in response to detecting that sample circuit 232 contains a logic "1," measure circuit 208 may select delay unit 230 to receive input signal 248. The output of delay unit 230 may be coupled to input 256 of output circuitry 104. This sets the amount of delay applied to signal 248 equal to the characteristic delay of delay unit 230.

In some embodiments, pulse generator 204 may be optionally included in MCD circuit 200. For example, input 250 may be coupled directly to input 254 of measure delay array 206. The falling edge of input 250 would then be detected by measure circuit 208 in order to determine the appropriate amount of delay to apply to input 248 in order to synchronize CLKOUT with CLKIN. Such an embodiment is generally less desirable, however, because coupling input 250 directly to measure delay array 206 typically requires additional logic to be included in connection with measure circuit 208 which results in, amongst other things, increased power consumption by MCD circuit 200.

Measure circuit 208 may significantly closely approximate the position of the pulse falling edge at time t1 when the pulse falling edge is received by time t1 at input 254 of measure delay array 206 (i.e., when the pulse falling edge is within measure delay array 206 at time t1). This is because the leftmost sample circuit storing a logic "1" significantly closely reflects the position of the pulse falling edge when the pulse falling edge is propagating through delay units 212-220 at time t1. The maximum phase error ($\phi_{error}$) in CLKOUT relative to CLKIN when the pulse falling edge is received at input 254 by time t1 can be represented in degrees by the following equation:

$$\phi_{error} = (t_{UD} * 360°)/T_{CLKIN} \quad (1)$$

where $T_{CLKIN}$ is the period (i.e., 1/frequency) of CLKIN and $t_{UD}$ is the characteristic unit delay of each of delay units 212-220.

However, measure circuit 208 may miscalculate the position of the pulse falling edge at time t1 when the pulse falling edge has not been received by time t1 at input 254 of measure delay array 206 (i.e., when pulse falling edge 260 is not within measure delay array 206 at time t1). This is because the leftmost sample circuit storing a logic "1" reflects the position at time t1 of some portion of the pulse other than the pulse falling edge (e.g., the pulse rising edge) when the pulse falling edge is not propagating through delay units 212-220 at time t1. Therefore, selecting the amount of delay applied to signal 248 based on the leftmost sample circuit storing a logic "1" in this case leads to an increased maximum phase error ($\phi_{error}+$) in CLKOUT relative to CLKIN. This increased maximum phase error can be represented in degrees by the following equation:

$$\phi_{error}+ = (t_{pulse} * 360°)/T_{CLKIN} \quad (2)$$

where $t_{pulse}$ is the width of the pulse generated by pulse generator 204 and $T_{CLKIN}$ is the period (i.e., 1/frequency) of CLKIN. In general, $t_{pulse}$ is selected to be greater than $t_{UD}$ (i.e., $t_{pulse} > t_{UD}$). This is because, for $t_{pulse} \leq t_{UD}$, the pulse may be positioned at the time t1 completely between the input and output of a delay unit of delay units 212-220, which may undesirably prevent sample circuits 232-240 from detecting the position of the pulse within measure delay array 206.

Figure 3:
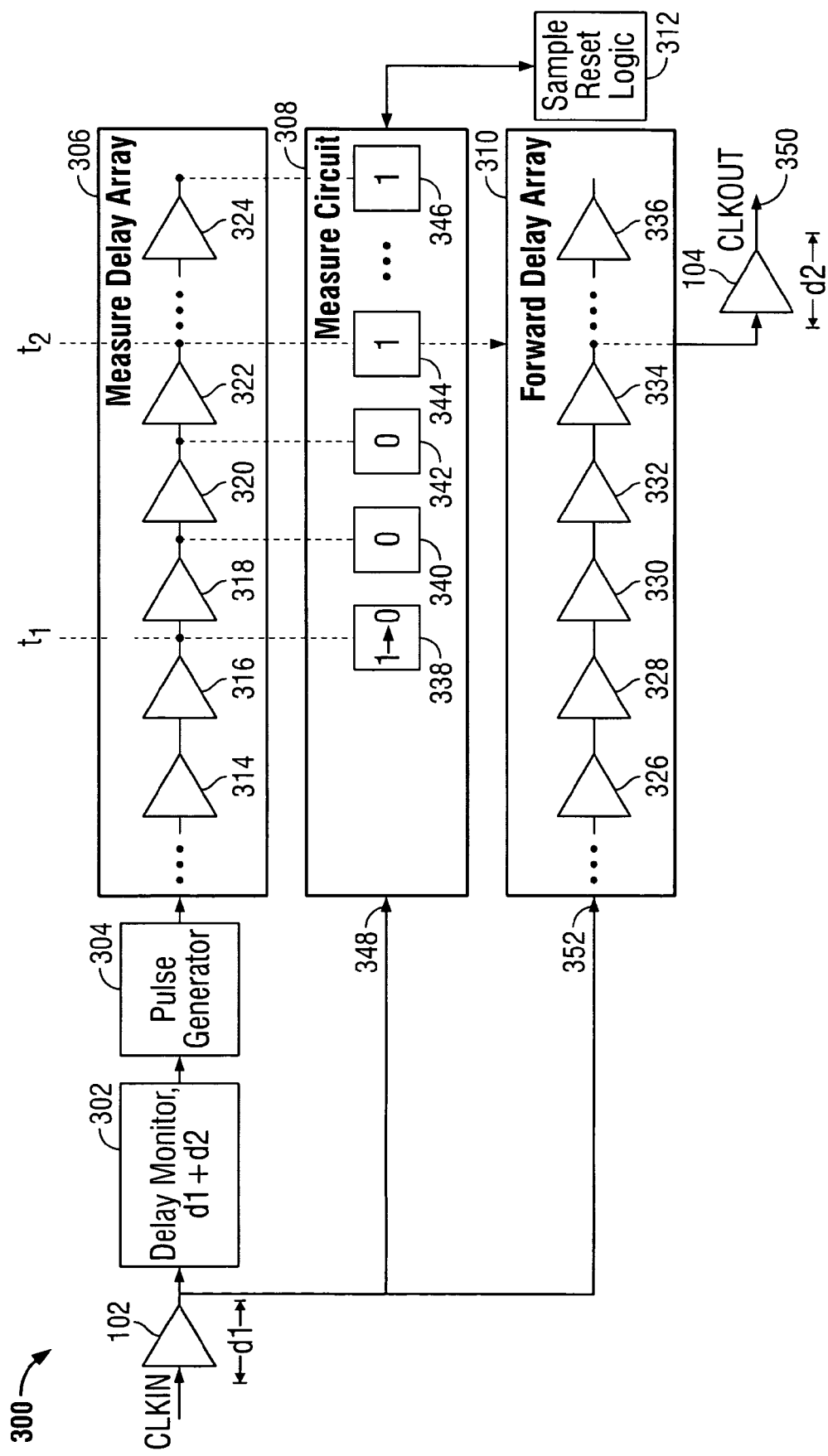
FIG. 3 is a block diagram of a measure-controlled delay circuit with reduced phase error in accordance with the present invention.

FIG. 3 shows an MCD circuit 300 in accordance with the present invention. MCD circuit 300 may be implemented on, for example, the device or chip shown in FIG. 1. MCD circuit 300 includes input circuitry 102 (FIG. 1), output circuitry 104 and clock synchronization circuitry including delay monitor 302, pulse generator 304, measure delay array 306, measure circuit 308, forward delay array 310 and sample reset logic 312. Input circuitry 102, output circuitry 104, delay monitor 302 and pulse generator 304 may be the same as the corresponding components shown in FIGS. 1 and 2 and therefore are not further described. Measure delay array 306 includes a plurality of delay units 314, 316, 318, 320, 322 and 324 coupled in series. Forward delay array 310 also includes a plurality of delay units 326, 328, 330, 332, 334 and 336 coupled in series. Measure circuit 308 includes a plurality of sample circuits 338, 340, 342, 344 and 346 (e.g., registers or latches) operative to sample, respectively, the outputs of delay units 316-324. Logic values (i.e., logic "1" or logic "0") corresponding to these samples may then be stored by sample circuits 338-346. The way that MCD circuit 300 uses these logic values to synchronize CLKOUT to CLKIN is described below. The one or more outputs of "spare" delay unit(s) 314 are not sampled. Similarly, spare delay unit(s) 326 are not selected to provide the output or receive the input of forward delay array 310 during synchronizing of CLKOUT to CLKIN by MCD circuit 300. For example, no sample circuits corresponding to spare delay units 314 and 326 may be provided in MCD circuit 300. As another example, sample circuits corresponding to spare delay units 314 and 326 may be disabled. Spare delay units 314 and 326 may be optionally included in MCD circuit 300 and are described in greater detail below in connection with FIG. 4.

MCD circuit 300 operates as follows: Sample circuits 338-346 sample the outputs of delay units 316-324 in response to triggering of measure circuit 308 at time t1 by a rising edge of input signal 348. Logic values (i.e., logic "0" or logic "1") that correspond to these samples and that approximate the position of pulse 350 in measure delay array 306 at time t1 are stored by sample circuits 338-346. When any of the leftmost N sample circuits of sample circuits 338-346 (i.e., the N sample circuits corresponding to the earliest N delay units in the serially-coupled chain of delay units 316-324) stores a logic "1," sample reset logic 312 prevents MCD circuit 300 from outputting CLKOUT at output 350. Illustrative sample reset logic 312 is described below in connection with FIG. 5. In particular, sample reset logic 312 may prevent measure circuit 308 from selecting any of delay units 328-336 to provide the output of forward delay array 310. For example, sample circuit 338 (i.e., the leftmost sample circuit of sample circuits 338-346) stores a logic "1" at time t1. Sample reset logic 312 may, for example, reset this logic value to logic "0" or otherwise prevent corresponding delay unit 328 from being selected to provide the output of forward delay array 310. Sample reset logic 312 may also disable sample circuit 338 in order to prevent sample circuit 338 from sampling the output of delay unit 316 in response to subsequent triggering of measure circuit 348. Alternatively, sample reset logic 312 may prevent measure circuit 308 from selecting any of delay units 328-336 from receiving input signal 352 as input. For example, in response to detecting that sample circuit 338 stores a logic "1," sample reset logic 312 may prevent measure circuit 308 from providing signal 352 to the input of delay unit 336. MCD circuit 300 provides CLKOUT at output 350 in response to triggering of measure circuit 308 at later time t2 when the leftmost N sample circuits do not store a logic "1" (e.g., when the leftmost N sample circuits are disabled). Measure circuit 308 may operate similar to, if not the same as, measure circuit 208 (FIG. 2) when the leftmost N sample circuits do not store a logic "1."

In accordance with the present invention, MCD circuit 300 outputs CLKOUT having an advantageously reduced phase error. In particular, as described above in connection with FIG. 2, MCD circuit 200 outputs CLKOUT at time t1 when the pulse falling edge is not within measure delay array 206. This leads to an undesirably increased maximum phase error equal to about $\phi_{error}+$ of above equation (2). For example, for $T_{CLKIN}$ equal to 1.428 nanoseconds (ns) (i.e., 1428 picoseconds (ps); 700 megahertz (MHz)), $t_{pulse}$ equal to 700 ps, and $t_{UD}$ equal to 240 ps, MCD circuit 200 outputs CLKOUT having $\phi_{error}+$ equal to about $(700*360°)/(1428) \approx 176.5°$. In contrast, because MCD circuit preferably waits until the pulse falling edge is received by measure delay array 306 to output CLKOUT, the maximum phase error observed in CLKOUT at output 350 is equal to about $\phi_{error}$ of equation (1) (i.e., $\phi_{error} = (t_{UD}*360°)/T_{CLKIN}$). Therefore, for the same values of $T_{CLKIN}$, $t_{pulse}$ and $t_{UD}$, MCD circuit 300 generates CLKOUT having a maximum phase error equal to about $(240*360°)/(1428) \approx 60.5°$, which is less than the maximum phase error provided by MCD circuit 200.

In accordance with the present invention, any suitable number (M) of the "leftmost" sample circuits (i.e., sample circuits corresponding to the M earliest delay units in the serially-coupled chain of delay units 316-324) may be reset to logic "0" or disabled when sample circuit 312 detects that one or more of the leftmost N sample circuits store logic "1s." Preferably, M is selected such that all sample circuits storing logic "1s" are reset to logic "0" or disabled when any of the leftmost N sample circuits stores a logic "1." This prevents MCD circuit 300 from outputting CLKOUT when pulse falling edge 354 is not within measure delay array 306 at the time measure delay array 306 is triggered. The number (M) of the leftmost sample circuits preferably reset or disabled by sample reset logic 312 can be represented by the following equation:

$$(t_{pulse}/t_{UD}) \leq M \leq (T_{CLKIN} - t_{pulse})/(t_{UD}) \quad (3)$$

where $t_{pulse}$ is the width of pulse 350, $T_{CLKIN}$ is the period of CLKIN and $t_{UD}$ is the characteristic unit delay of each of delay units 316-324. N is greater than or equal to 1. However, increasing the value of N can lead to an increase the characteristic lock time of MCD circuit 300.

Using, for example, the values of $t_{pulse}$, $t_{UD}$ and $T_{CLKIN}$ of the above example (i.e., $t_{pulse}$=700 ps, $t_{UD}$=240 ps and $T_{CLKIN}$=1428 ps), equation (3) becomes (700/240)$\leq$M$\leq$ (1428−700)/(240), or equivalently, 2.91$\leq$M$\leq$3.03. Therefore, sample circuit 312 preferably resets the leftmost three (i.e., M=3) sample circuits of sample circuits 338-346 (i.e., sample circuits 338, 340 and 342) when any of the leftmost N (e.g., N=1) sample circuits of sample circuits 338-346 stores a logic "1." This equation holds when $t_{pulse}$ and $T_{CLKIN}$ are constant and when $t_{UD}$ is the same for each of delay units 316-324. When one or both of $t_{pulse}$ and $T_{CLKIN}$ are variable, the values for the minimum pulse width and the minimum clock period are used in the right-hand side of the equation. Similarly, when $t_{UD}$ is not the same for each of delay units 316-324, the minimum characteristic delay of delay units 316-324 is used in the right-hand side of the equation.

Figure 4:
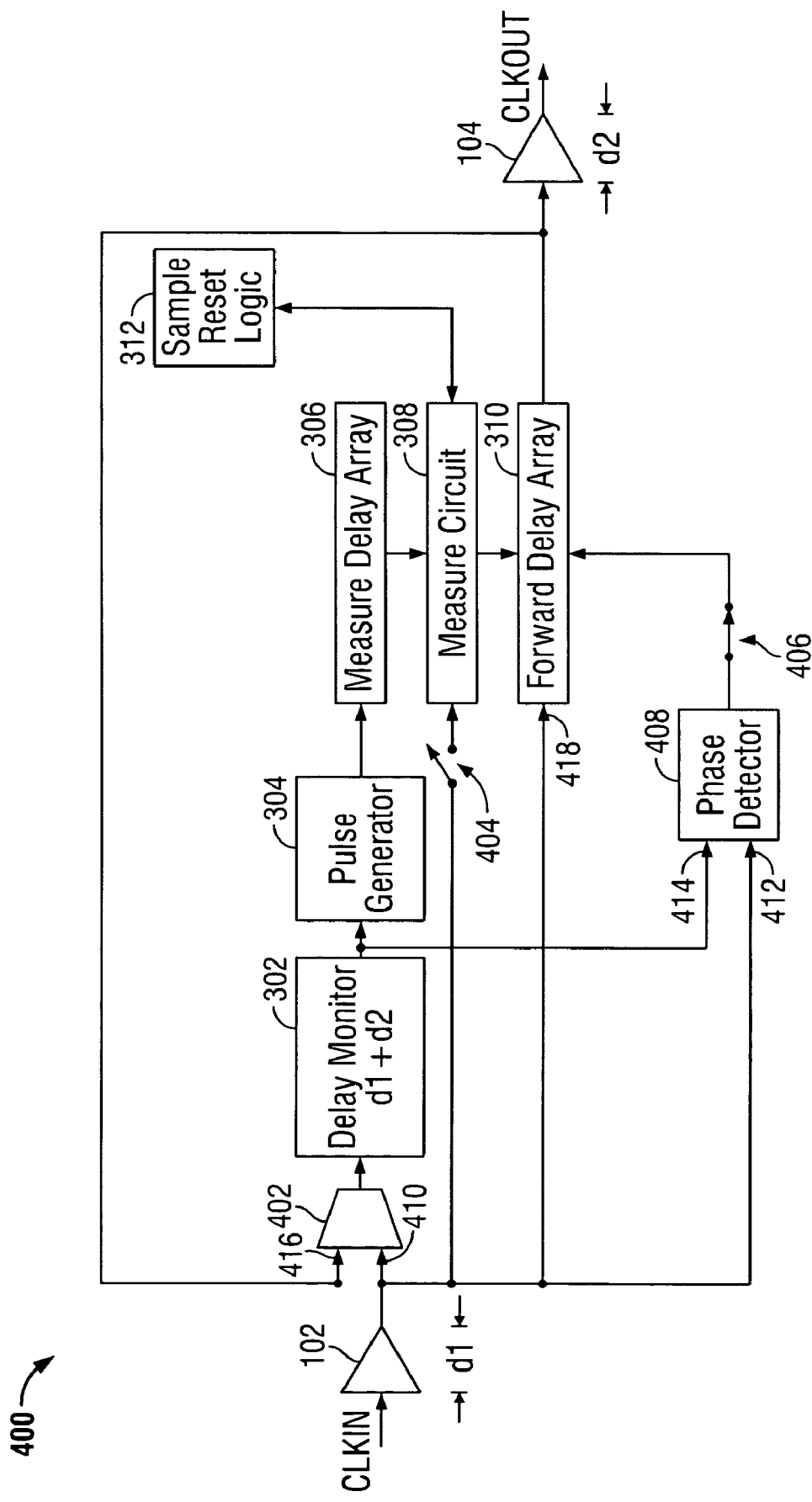
FIG. 4 is a block diagram of another embodiment of a measure-controlled delay circuit with reduced phase error in accordance with the present invention.

FIG. 4 shows another embodiment of a clock synchronization circuit 400 in accordance with the present invention. Circuit 400 may be implemented on, for example, the device or chip shown in FIG. 1. Circuit 400 includes input circuitry 102, output circuitry 104 and MCD clock synchronization circuitry including delay monitor 302, pulse generator 304, measure delay array 306, measure circuit 308, forward delay array 310 and sample reset logic 312. Components 102, 104 and 302-312 may be the same as the corresponding components of FIGS. 1 and 3 are therefore not described in detail. Circuit 400 also includes multiplexer 402, switches 404 and 406 and phase detector 408. Together with forward delay array 310, circuitry 402-408 forms a digital delay-locked loop (DDLL) circuit operative to maintain a synchronized state of CLKOUT after MCD clock synchronization circuitry 302-312 initially synchronizes CLKOUT to CLKIN.

Clock synchronization circuit 400 operates as follows: During synchronizing of CLKOUT to CLKIN by MCD clock synchronization circuitry 302-312, switch 404 is closed, switch 406 is open and multiplexer 402 provides signal 410 from the output of input circuitry 102 to delay monitor 302. Multiplexer 402, switch 404 and switch 406 may be controlled using any suitable one or more signals that indicate whether MCD clock synchronization circuitry 302-312 has synchronized (i.e., "locked") CLKOUT to CLKIN. For example, phase detector 408 receives the outputs of input circuitry 102 and delay monitor 302 at respective inputs 412 and 414. Phase detector 408 compares the phases of inputs 412 and 414, and may provide to multiplexer 402, switch 404 and switch 406 a signal indicating whether inputs 412 and 414 are in-phase (e.g., a LOCK signal having a first logic value when signals 412 and 414 are in-phase and having the complement logic value when the signals are out-of-phase). At or about the time that the MCD clock synchronization circuitry 302-312 synchronizes CLKOUT to CLKIN (e.g., using the approach described above in connection with FIG. 3), switch 404 opens, switch 406 closes and multiplexer 402 provides signal 416 from the output of forward delay array 310 to delay monitor 302. The DDLL circuit of circuit 400 then adjusts for variations in one or more of process, voltage and temperature (i.e., PVT variations) of circuit 400 that may cause CLKOUT to become unsynchronized with CLKIN.

In particular, when CLKOUT loses synchronization to CLKIN, phase detector 408 resynchronizes CLKOUT by adjusting the amount of delay that forward delay array 310 applies to input signal 418. In particular, as described above, phase detector 408 measures a phase difference between inputs 412 and 414. This measurement indicates the amount of delay that must be applied to signal 418 in order to synchronize CLKOUT with CLKIN. When this measurement indicates that additional delay must be provided, phase detector 408 causes input signal 418 to be fed through additional delay units of delay units 326-336. Conversely, when this measurement indicates that less delay must be provided, phase detector 408 causes input signal 418 to be fed through fewer delay units of delay units 326-336.

In accordance with another aspect of the present invention, one or more "spare" delay units 326 (e.g., 6 delay units) may be included in forward delay array 310 that allow an associated DDLL circuit to maintain CLKOUT synchronized to CLKIN over a wider range of PVT variations. In particular, as described above in connection with FIG. 3, spare delay unit(s) 326 included in forward delay array 310 are not selected by MCD circuit 300 to provide the output or receive the input of forward delay array 310 during initial synchronization of CLKOUT to CLKIN by MCD circuit 300. Therefore, when the associated DDLL circuit initially takes over from the MCD clock synchronization circuitry to maintain CLKOUT synchronized to CLKIN, the spare delay unit(s) are substantially always available for selection by phase detector 408 to adjust the delay applied to input signal 418. Without spare delay unit(s) 326, the DDLL circuit may be unable to adjust for PVT variations that necessitate an adjusted amount of delay. Spare delay unit(s) 326 are shown in FIG. 3 as being included at the beginning of the serially-coupled chain of delay units of forward delay array 310. In other embodiments, spare delay units may also or alternatively be provided at the end of the serially-coupled chain of delay units of forward delay array 310. Typically, spare delay unit(s) 314 corresponding to delay unit(s) 326 in both number and characteristic unit delay are provided in measure delay array 306 whenever spare delay unit(s) 326 are provided in forward delay array 310. In some embodiments of the present invention, spare delay units may be included in an MCD circuit that does not include sample reset logic 312 (e.g., MCD circuit 200).

Figure 5:
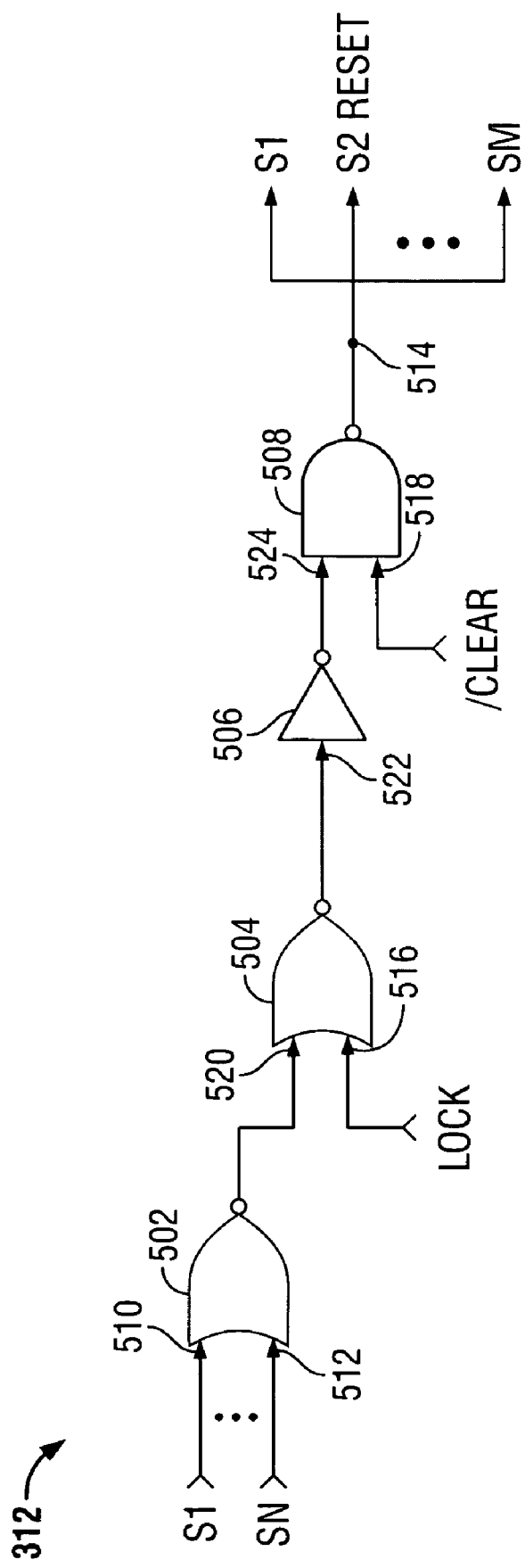
FIG. 5 is a circuit diagram of an illustrative embodiment of the sample reset logic of the measure-controlled delay circuits of FIGS. 3 and 4 in accordance with the present invention.

FIG. 5 is a circuit diagram of an illustrative embodiment of sample reset logic 312 of the MCD circuits of FIGS. 3 and 4 in accordance with the present invention. Referring to FIGS. 3 and 5, sample reset logic 312 includes NOR gates 502 and 504, inverter 506 and NAND gate 508. NOR gate 502 receives the samples stored by the N leftmost sample circuits 338-346. For example, for N equal to 2 (i.e., N=2), NOR gate 502 receives the samples stored by sample circuits 338 and 340 at inputs 510 and 512. For N=1 (i.e., NOR gate 502 receives only the sample of sample circuit 338), NOR gate 502 can be replaced by a logic inverter having a single input. In general, when any one or more of the N leftmost sample circuits coupled to an input of NOR gate 502 stores a logic "1," sample reset logic 312 resets to logic "0" the logic values stored by all of the M leftmost sample circuits coupled to output 514 of NAND gate 508. This prevents delay units corresponding to the M leftmost sample circuits from being selected by measure circuit 308 to provide the output of forward delay array 310. For example, for M equal to 3 (i.e., M=3), sample reset logic 312 resets the logic values stored by sample circuits 338, 340 and 342 to logic "0" or disables sample circuits 338-342 when any of the N leftmost sample circuits coupled to an input of NOR gate 502 stores a logic "1."

LOCK signal received at input 516 of NOR gate 504 indicates whether CLKOUT is synchronized with CLKIN. During signal locking by MCD circuit 300, LOCK signal 516 is logic "0." LOCK signal 516 is logic "1" when CLKOUT is synchronized with CLKIN. LOCK signal 516 may be, for example, the same signal (e.g., provided by phase detector 408) used to control operation of multiplexer 402 and switches 404 and 406 of clock synchronization circuit 400 (FIG. 4). NOR gate 504 and LOCK signal 516 may only be included in sample reset logic 312 when an associated clock synchronization circuit (e.g., the DDLL circuit of circuit 400 (FIG. 4)) takes over to maintain a synchronized state of CLKOUT after an MCD circuit initially synchronizes CLKOUT to CLKIN. When the MCD circuit operates to generate initially and then maintain the synchronized state of CLKOUT, NOR gate 504 and inverter 506 may be removed from sample reset logic 312, and signal 520 may be received at input 524. /CLEAR signal received at input 518 of NAND gate 508 is the complement (i.e., logic invert) of a signal indicating that the M sample circuits coupled to output 514 must be reset or disabled. Typically, /CLEAR signal 518 is logic "1" during synchronizing of CLKOUT to CLKIN by an associated MCD circuit. /CLEAR signal 518 may be logic "0" at, for example, power up or in response to a malfunction of an associated clock synchronization circuit (e.g., in response to a failure of an associated DDLL circuit to maintain CLKOUT synchronized to CLKIN).

Sample reset logic 312 resets the logic values of the M sample circuits coupled to output 514 as follows: In response to detecting logic "1" at one or both of inputs 510 and 512, NOR gate 502 outputs logic "0" to input 520 of NOR gate 504. NOR gate 504 outputs logic "1" to input 522 of inverter 506 because, as described above, LOCK signal 516 is logic "0" during signal locking by MCD circuit 300. Inverter 506 outputs logic "0" to input 524 of NAND gate 508. NAND gate 508 then outputs logic "1" to output 514 because, as described above, /CLEAR signal 518 is typically logic "1" during locking by MCD circuit 300. Logic "1" at output 514 causes the logic values of the M leftmost sample circuits of sample circuits 338-346 to be reset to logic "0" or to be disabled.

Figure 6:
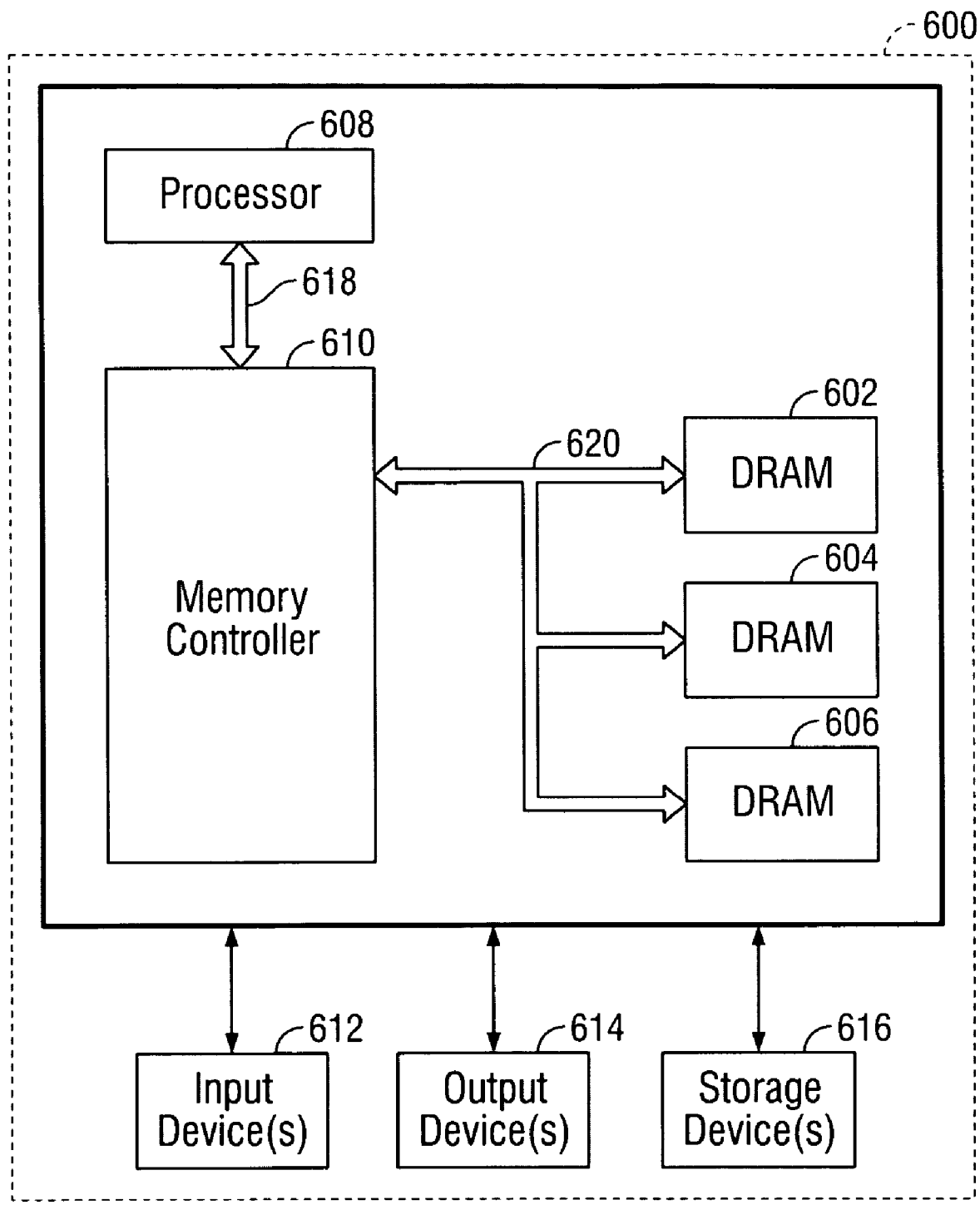
FIG. 6 is a block diagram of a system that incorporates a measure-controlled delay circuit of the present invention.

FIG. 6 shows a system that incorporates the invention. System 600 includes a plurality of DRAM chips 602, 604 and 606, a processor 608, a memory controller 610, input devices 612, output devices 614, and optional storage devices 616. Data and control signals are transferred between processor 608 and memory controller 610 via bus 618. Similarly, data and control signals are transferred between memory controller 610 and DRAM chips 602, 604 and 606 via bus 620. One or more DRAM chips 602, 604 and 606 include an MCD circuit in accordance with the invention (e.g., MCD circuit 300 (FIG. 3) or MCD circuit 400 (FIG. 4)). For example, one or more of the DRAM chips may include such an MCD circuit to synchronize DRAM read, write and refresh operations with a reference signal received from memory controller 610. Input devices 612 can include, for example, a keyboard, a mouse, a touch-pad display screen, or any other appropriate device that allows a user to enter information into system 600. Output devices 614 can include, for example, a video display unit, a printer, or any other appropriate device capable of providing output data to a user. Input devices 612 and output devices 614 can alternatively be a single input/output device. Storage devices 616 can include, for example, one or more disk or tape drives. System 600 is only exemplary. The invention is applicable to any other suitable systems and integrated circuits that have MCD circuits.

Thus it is seen that circuits and methods for reducing phase error of MCD circuits are provided. One skilled in the art will appreciate that the invention can be practiced by other than the described embodiments, which are presented for purposes of illustration and not of limitation, and the present invention is limited only by the claims which follow.

I claim:

1. A method for synchronizing an output clock signal to an input clock signal, said method comprising:
   receiving and delaying by a first delay array a signal that corresponds to said input clock signal;
   generating outputs of said first delay array in response to said delaying;
   sampling said outputs of said first delay array;
   detecting whether a sample taken from a predetermined at least one of said outputs corresponds to a particular logic value; and
   preventing selection of a delay unit of a second delay array when said sample corresponds to said particular logic value, said second delay array being configured to receive said input clock signal, and to generate said output clock signal by delaying said input clock signal, in response to said selection.

2. The method of claim 1 further comprising delaying said input clock signal to produce a delayed input clock signal, wherein receiving and delaying said signal comprises receiving and delaying said delayed input clock signal.

3. The method of claim 1 further comprising generating a pulse based on said input clock signal, wherein receiving and delaying said signal comprises receiving and delaying said pulse.

4. The method of claim 1 further comprising:
   delaying said input clock signal to produce a delayed input clock signal; and
   generating a pulse based on said delayed input clock signal,
   wherein receiving and delaying said signal comprises receiving and delaying said pulse.

5. The method of claim 1 wherein receiving and delaying said signal comprises receiving and delaying said input clock signal.

6. The method of claim 1 further comprising outputting said output clock signal by said second delay array when said sample corresponds to a logic invert of said particular logic value.

7. The method of claim 6 wherein outputting said output clock signal comprises selecting a delay unit from said second delay array to provide the output of said second delay array.

8. The method of claim 6 wherein outputting said output clock signal comprises selecting a delay unit from said second delay array to receive said input clock signal as input.

9. The method of claim 6 wherein said outputting said output clock signal comprises outputting said output clock signal having a maximum phase error proportional to a characteristic delay of a single delay unit.

10. The method of claim 1 wherein said receiving and delaying said pulse by said first delay array comprises receiving and delaying said pulse by a first delay array comprising a plurality of delay units coupled in series, said plurality of delay units having the same characteristic delay.

11. The method of claim 1 wherein said sampling said outputs comprises sampling said outputs in response to a signal transition of said input clock signal.

12. The method of claim 1 wherein:
said receiving and delaying said pulse by said first delay array comprises receiving and delaying said pulse by a first delay array comprising a plurality of delay units coupled in series; and
said detecting whether a sample taken from a predetermined at least one of said outputs corresponds to a particular logic value comprises detecting whether a sample taken from an output of an earliest delay unit of said plurality of delay units corresponds to said particular logic value.

13. The method of claim 1 further comprising storing logic values corresponding to samples taken from said outputs of said first delay array.

14. The method of claim 13 wherein said preventing output of said output clock signal comprises resetting at least one of said logic values.

15. A measure-controlled delay circuit configured to synchronize an output clock signal to an input clock signal, said circuit comprising:
a first delay array comprising a first plurality of serially-coupled delay units configured to receive and delay a signal that corresponds to said input clock signal and to generate outputs of said first delay array in response to said delaying;
a second delay array comprising a second plurality of serially-coupled delay units configured to receive said input clock signal, and to generate said output clock signal by delaying said input clock signal, in response to a selection of one of said second plurality of serially-coupled delay units;
a measure circuit comprising a plurality of sample circuits configured to sample outputs of said first plurality of serially-coupled delay units in response to triggering of said measure circuit and to perform said selection; and
a logic circuit coupled to said measure circuit and configured to:
detect whether a sample taken from a predetermined at least one of said outputs corresponds to a particular logic value; and
prevent said selection when said sample corresponds to said particular logic value.

16. The circuit of claim 15 further comprising a delay monitor configured to delay said input clock signal to produce a delayed input clock signal, wherein said signal that corresponds to said input clock signal that is received and delayed by said first delay array is said delayed input clock signal.

17. The circuit of claim 15 further comprising a pulse generator configured to generate a pulse based on said input clock signal, wherein said signal that corresponds to said input clock signal that is received and delayed by said first delay array is said pulse.

18. The circuit of claim 15 further comprising:
a delay monitor configured to delay said input clock signal to produce a delayed input clock signal; and
a pulse generator configured to generate a pulse based on said delayed input clock signal,
wherein said signal that corresponds to said input clock signal that is received and delayed by said first delay array is said pulse.

19. The circuit of claim 15 wherein said signal that corresponds to said input clock signal that is received and delayed by said first delay array is said input clock signal.

20. The circuit of claim 15 wherein said second delay array generates said output clock signal when said sample corresponds to a logic invert of said particular logic value.

21. The circuit of claim 20 wherein said measure circuit is further configured to select a delay unit from said second delay array to provide the output of said second delay array.

22. The circuit of claim 20 wherein said measure circuit is further configured to select a delay unit from said second delay array to receive said input clock signal as input.

23. The circuit of claim 20 wherein said output clock signal output by said second delay array has a maximum phase error proportional to a characteristic delay of a delay unit of said second delay array.

24. The circuit of claim 15 wherein said plurality of serially-coupled delay units have the same characteristic delay.

25. The circuit of claim 15 wherein said measure circuit is triggered by a signal transition of said input clock signal.

26. The circuit of claim 15 wherein said sample is taken from an output of an earliest delay unit of said plurality of serially-coupled delay units.

27. The circuit of claim 15 wherein said sample circuits are configured to store logic values corresponding to samples taken from said outputs.

28. The circuit of claim 27 wherein said logic circuit is configured to reset at least one of said logic values.

29. A computer system comprising:
a processor;
a memory controller coupled to said processor; and
a plurality of dynamic random access memory (DRAM) chips coupled to said memory controller, at least one of said DRAM chips comprising a clock synchronization circuit comprising:
a first delay array operative to receive and delay a signal that corresponds to an input clock signal and to generate outputs of said first delay array in response to said delaying;
a second delay array operative to receive said input clock signal, and to generate an output clock signal by delaying said input clock signal, in response to a selection of a delay unit of said second delay array;
a measure circuit operative to, in response to triggering of said measure circuit, sample said outputs of said first delay array and to perform said selection; and
a logic circuit coupled to said measure circuit and operative to:
detect whether a sample taken from a predetermined at least one of said outputs corresponds to a particular logic value; and
prevent said selection when said sample corresponds to said particular logic value.

30. A memory comprising:
at least one memory cell; and
a clock synchronization circuit comprising:
means for receiving and delaying a signal that corresponds to an input clock signal;
means for generating outputs of said means for receiving and delaying said signal;
means for sampling said outputs;
means for detecting whether a sample taken from a predetermined at least one of said outputs corresponds to a particular logic value;

means for preventing selection of a delay unit when said sample corresponds to said particular logic value; and means for receiving said input clock signal, and generating an output clock signal by delaying said input clock signal, in response to said selection, wherein at least one of a read, write and refresh operation of said at least one memory cell is performed based on said output clock signal.

* * * * *